United States Patent
Watanabe et al.

(10) Patent No.: US 10,526,721 B2
(45) Date of Patent: Jan. 7, 2020

(54) METHOD FOR GROWING β-GA$_2$O$_3$-BASED SINGLE CRYSTAL

(71) Applicants: TAMURA CORPORATION, Nerima-ku, Tokyo (JP); KOHA CO., LTD., Nerima-ku, Tokyo (JP)

(72) Inventors: Shinya Watanabe, Tokyo (JP); Kazuyuki Iizuka, Tokyo (JP); Kei Doioka, Tokyo (JP); Haruka Matsubara, Tokyo (JP); Takekazu Masui, Tokyo (JP)

(73) Assignees: KOHA CO., LTD., Nerima-ku, Tokyo (JP); TAMURA CORPORATION, Nerima-ku, Tokyo (JP)

( * ) Notice: Subject to any disclaimer, the term of this patent is extended or adjusted under 35 U.S.C. 154(b) by 471 days.

(21) Appl. No.: 14/782,039

(22) PCT Filed: Mar. 31, 2014

(86) PCT No.: PCT/JP2014/059572
§ 371 (c)(1),
(2) Date: Oct. 2, 2015

(87) PCT Pub. No.: WO2014/163056
PCT Pub. Date: Oct. 9, 2014

(65) Prior Publication Data
US 2016/0032485 A1  Feb. 4, 2016

(30) Foreign Application Priority Data
Apr. 4, 2013  (JP) .................................. 2013-078575

(51) Int. Cl.
C30B 15/34  (2006.01)
C30B 29/16  (2006.01)
C30B 15/04  (2006.01)

(52) U.S. Cl.
CPC .............. *C30B 15/34* (2013.01); *C30B 15/04* (2013.01); *C30B 29/16* (2013.01)

(58) Field of Classification Search
CPC .......... C30B 15/04; C30B 15/34; C30B 29/16
See application file for complete search history.

(56) References Cited

U.S. PATENT DOCUMENTS

2003/0107098 A1  6/2003  Ota et al.
2004/0007708 A1*  1/2004  Ichinose ................. C30B 15/00
                                                      257/79

(Continued)

FOREIGN PATENT DOCUMENTS

CN     1754013 A1   3/2006
CN   103958746 A    7/2014

(Continued)

OTHER PUBLICATIONS

International Search Report dated May 13, 2014 issued in PCT/JP2014/059572.

(Continued)

*Primary Examiner* — Hua Qi
(74) *Attorney, Agent, or Firm* — Scully Scott Murphy and Presser (57) ABSTRACT

Provided is a method for growing a β-Ga$_2$O$_3$-based single crystal, whereby it becomes possible to grow a β-Ga$_2$O$_3$-based single crystal having a small variation in crystal structure and also having a high quality in the direction of a b axis. In one embodiment, a method for growing a β-Ga$_2$O$_3$-based single crystal includes growing a plate-shaped Sn doped β-Ga$_2$O$_3$-based single crystal in the direction of the b axis using a seed crystal.

1 Claim, 8 Drawing Sheets

(56) References Cited

U.S. PATENT DOCUMENTS

| | | |
|---|---|---|
| 2006/0150891 A1 | 7/2006 | Ichinose et al. |
| 2007/0166967 A1* | 7/2007 | Ichinose ................ C30B 13/00 438/510 |
| 2008/0265264 A1 | 10/2008 | Ichinose et al. |
| 2010/0229789 A1 | 9/2010 | Ichinose et al. |
| 2012/0304918 A1 | 12/2012 | Ichinose et al. |
| 2014/0217405 A1 | 8/2014 | Sasaki et al. |
| 2014/0352604 A1 | 12/2014 | Koshi et al. |
| 2016/0365418 A1 | 12/2016 | Sasaki et al. |

FOREIGN PATENT DOCUMENTS

| | | |
|---|---|---|
| EP | 1 598 450 A2 | 11/2005 |
| EP | 2 801 645 A1 | 11/2014 |
| JP | 2002-093243 A | 3/2002 |
| JP | 2004-262684 A | 9/2004 |
| JP | 2005-235961 A | 9/2005 |
| JP | 2006-273684 A | 10/2006 |
| JP | 2006-312571 A | 11/2006 |
| JP | 2006312571 A * | 11/2006 |
| JP | 2006312571 A * | 11/2006 |
| JP | 2008-037725 A | 2/2008 |
| JP | 2008-156141 A | 7/2008 |
| JP | 2011-190127 A | 9/2011 |
| WO | 2013035845 A1 | 3/2013 |

OTHER PUBLICATIONS

Official Action dated Feb. 10, 2015 received from the Japanese Patent Office in related application JP 2013-078575 together with English language translation.

Offical Action dated Jun. 29, 2017 received from the Chinese Patent Office in related application CN 201480020148.X together with English language translation.

Extended European Search Report dated Dec. 21, 2016 received from EPO in related application EP 14 77 9805.2.

\* cited by examiner

DIRECTION PERPENDICULAR
TO AXIS-b

FIG.3B

DIRECTION PERPENDICULAR
TO AXIS-b

METHOD FOR GROWING β-Ga$_2$O$_3$-BASED SINGLE CRYSTAL

TECHNICAL FIELD

The invention relates to a method for growing a β-Ga$_2$O$_3$-based single crystal.

BACKGROUND ART

Use of EFG (Edge-defined Film-fed Growth) technique to grow a flat-plate-shaped Ga$_2$O$_3$ single crystal is known as a conventional method (see, e.g., PTL 1).

In PTL 1, SiO$_2$ is used as a dopant material to introduce Si into a Ga$_2$O$_3$ single crystal. Since SiO$_2$ has a small melting point difference from the Ga$_2$O$_3$ and has a low vapor pressure at a growth temperature of the Ga$_2$O$_3$ single crystal (at a melting point of a raw material of the Ga$_2$O$_3$ single crystal), it is easy to control the amount of dopant in the Ga$_2$O$_3$ single crystal.

Meanwhile, use of FZ (Floating Zone) technique to grow a column-shaped β-Ga$_2$O$_3$-based single crystal is also known as a conventional method (see, e.g., PTL 2).

In PTL 2, Si, Sn, Zr, Hf or Ge, etc., used as a thermally meltable control additive are added to a β-Ga$_2$O$_3$-based single crystal. Addition of the thermally meltable control additive increases infrared absorption properties of the β-Ga$_2$O$_3$-based single crystal and causes the β-Ga$_a$O$_3$-based single crystal to efficiently absorb infrared light from a light source of a FZ apparatus. Thus, even in a β-Ga$_2$O$_3$-based single crystal having a large outer diameter, a temperature difference between the center portion and the outer portion is reduced and the center portion is not solidified easily.

CITATION LIST

Patent Literature

[PTL 1]
JP-A-2011-190127
[PTL 2]
JP-A-2006-273684

SUMMARY OF INVENTION

Technical Problem

It is an object of the invention to provide a method for growing a β-Ga$_2$O$_3$-based single crystal which allows a high-quality β-Ga$_2$O$_3$-based single crystal having small variation in crystal structure to grow in a b-axis direction.

According to one embodiment of the invention, a method for growing a β-Ga2O3-based single crystal set forth in [1] to [3] below is provided so as to achieve the above object.

[1] A method for growing a β-Ga2O3-based single crystal comprises growing a plate-shaped Sn-doped β-Ga2O3-based single crystal in a direction of a b-axis using a seed crystal.

[2] The method for growing a β-Ga2O3-based single crystal according to [1], wherein the β-Ga2O3-based single crystal is grown by EFG method.

[3] The method for growing a β-Ga2O3-based single crystal according to [1] or [2], wherein a concentration of Sn doped into the β-Ga2O3-based single crystal is not less than 0.005 mol % and not more than 1.0 mol %.

Advantageous Effects of the Invention

According to the invention, a method for growing β-Ga$_2$O$_3$-based single crystal can be provided which allows a high-quality β-Ga$_2$O$_3$-based single crystal having small variation in crystal structure to grow in a b-axis direction.

DESCRIPTION OF EMBODIMENT

Embodiment

In the present embodiment, a plate-shaped β-Ga$_2$O$_3$-based single crystal doped with Sn is grown from a seed crystal in a b-axis direction. It is thereby possible to obtain a β-Ga$_2$O$_3$-based single crystal with small crystal quality variation in a direction perpendicular to the b-axis direction.

Conventionally, Si is often used as a conductive impurity to be doped into a Ga$_2$O$_3$ crystal. Among conductive impurities to be doped into the Ga$_2$O$_3$ crystal, Si has a relatively low vapor pressure at a growth temperature of a Ga$_2$O$_3$ single crystal and there is less evaporation during crystal growth. Therefore, conductivity of the Ga$_2$O$_3$ crystal is relatively easily controlled by adjusting an amount of Si to be added.

On the other hand, as compared to Si, Sn has higher vapor pressure at a growth temperature of a Ga$_2$O$_3$ single crystal and there is more evaporation during crystal growth. Therefore, it is somewhat difficult to handle Sn as a conductive impurity to be doped into the Ga$_2$O$_3$ crystal.

However, concerning addition of Si, the inventors of the present invention found a problem that, under a specific condition such as growing a plate-shaped β-Ga$_2$O$_3$-based single crystal in a b-axis direction, the crystal structure is uniform in the b-axis direction but varies greatly in a direction perpendicular to the b-axis. Then, the inventors of the present invention found that this problem can be solved by adding Sn instead of Si.

(Growth of β-Ga$_2$O$_3$-Based Single Crystal)

A method using EFG (Edge-defined film-fed growth) technique will be described below as an example method of growing a plate-shaped β-Ga$_2$O$_3$-based single crystal. However, the growth method of a plate-shaped β-Ga$_2$O$_3$-based single crystal in the present embodiment is not limited to the EFG method and may be another growth method, e.g., a pulling-down method such as micro-PD (pulling-down) method. Alternatively, a plate-shaped β-Ga$_2$O$_3$-based single crystal may be grown by the Bridgman method combined with a die having a slit as is a die used in the EFG method.

Figure 1:
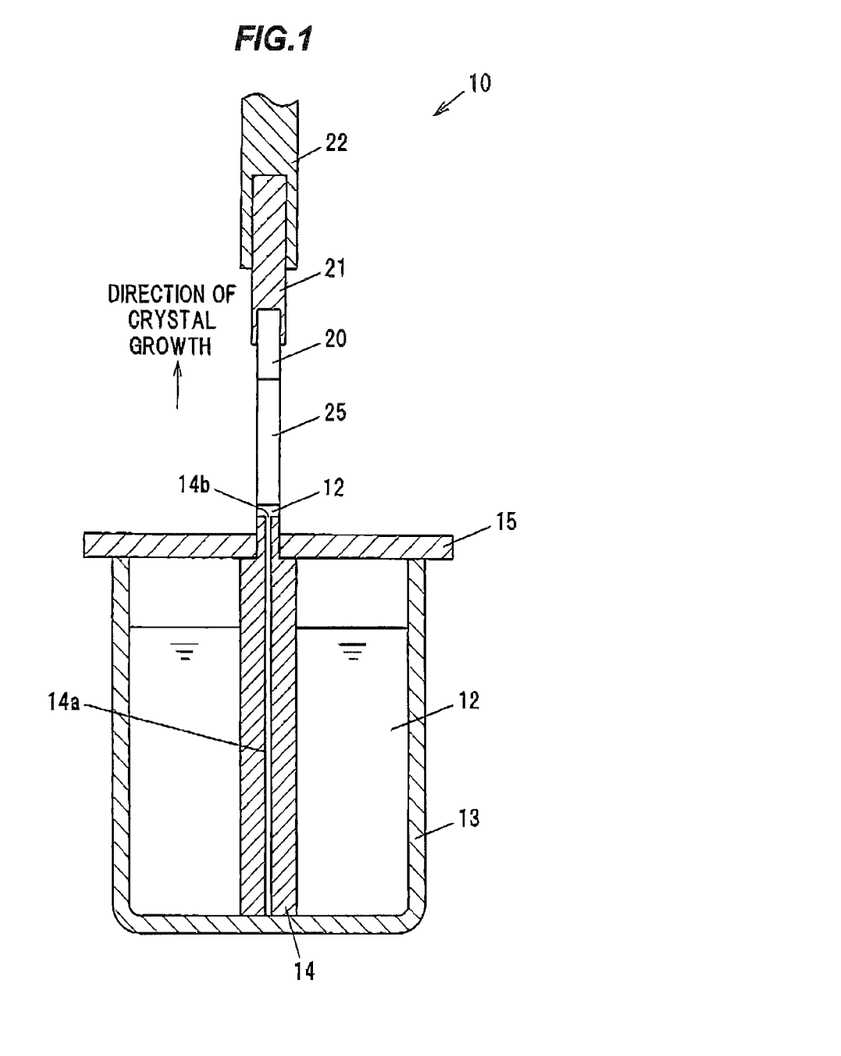
FIG. 1 is a vertical cross-sectional view showing a part of an EFG crystal manufacturing apparatus in an embodiment.

FIG. 1 is a vertical cross-sectional view showing a part of an EFG crystal manufacturing apparatus in the present embodiment. An EFG crystal manufacturing apparatus 10 has a crucible 13 containing Ga$_2$O$_3$-based melt 12, a die 14 placed in the crucible 13 and having a slit 14a, a lid 15 covering the upper surface of the crucible 13 so that the upper portion of the die 14 including an opening 14b of the slit 14a is exposed, a seed crystal holder 21 for holding a β-Ga$_2$O$_3$-based seed crystal (hereinafter, referred as "seed crystal") 20, and a shaft 22 vertically movably supporting the seed crystal holder 21.

The crucible 13 contains the Ga$_2$O$_3$-based melt 12 which is obtained by melting Ga$_2$O$_3$-based powder. The crucible 13 is formed of a heat-resistant material such as iridium capable of containing the Ga$_2$O$_3$-based melt 12.

The die 14 has the slit 14a to draw up the Ga$_2$O$_3$-based melt 12 by capillary action.

The lid 15 prevents the high-temperature Ga$_2$O$_3$-based melt 12 from evaporating from the crucible 13 and further prevents the vapor of the Ga$_2$O$_3$-based melt 12 from attaching to a portion other than the upper surface of the slit 14a.

The seed crystal 20 is moved down and is brought into contact with the Ga$_2$O$_3$-based melt 12 on the top surface of the die 14 spreading from the opening 14b of the slit 14a. Then, the seed crystal 20 in contact with the Ga$_2$O$_3$-based melt 12 is pulled up, thereby growing a plate-shaped β-Ga$_2$O$_3$-based single crystal 25. The crystal orientation of the β-Ga$_2$O$_3$-based single crystal 25 is the same as the crystal orientation of the seed crystal 20 and, for example, a plane orientation and an angle in a horizontal plane of the bottom surface of the seed crystal 20 are adjusted to control the crystal orientation of the β-Ga$_2$O$_3$-based single crystal 25.

Figure 2:
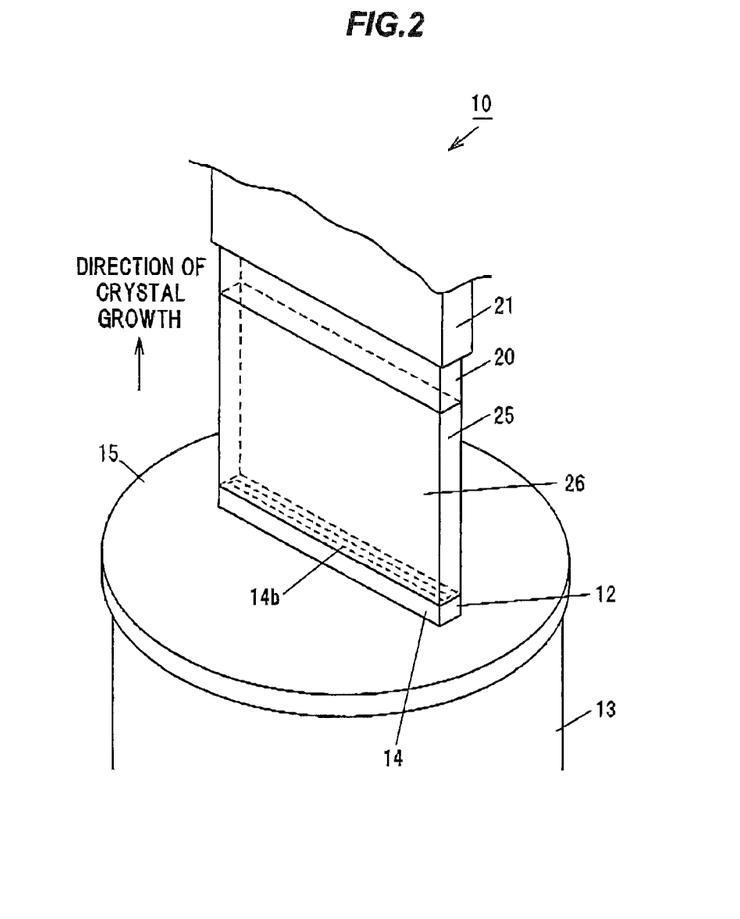
FIG. 2 is a perspective view showing a state during growth of a β-Ga$_2$O$_3$-based single crystal.

FIG. 2 is a perspective view showing a state during growth of a β-Ga$_2$O$_3$-based single crystal. A surface 26 in FIG. 2 is a main surface of the β-Ga$_2$O$_3$-based single crystal 25 which is parallel to a slit direction of the slit 14a. When a β-Ga$_2$O$_3$-based substrate is formed by cutting out from the grown β-Ga$_2$O$_3$-based single crystal 25, the plane orientation of the surface 26 of the β-Ga$_2$O$_3$-based single crystal 25 is made to coincide with the desired plane orientation of the main surface of the β-Ga$_2$O$_3$-based substrate. When forming a β-Ga$_2$O$_3$-based substrate of which main surface is, e.g., a (−201) plane, the plane orientation of the surface 26 is (−201). The grown β-Ga$_2$O$_3$-based single crystal 25 also can be used as a seed crystal for growing a new β-Ga$_2$O$_3$-based single crystal. The crystal growth direction shown in FIGS. 1 and 2 is a direction parallel to the b-axis of the β-Ga$_2$O$_3$-based single crystal 25 (the b-axis direction).

The β-Ga$_2$O$_3$-based single crystal 25 and the seed crystal 20 are β-Ga$_2$O$_3$ single crystals or Ga$_2$O$_3$ single crystals doped with an element such as Al or In and may be, e.g., a (Ga$_x$Al$_y$In$_{(1-x-y)}$)$_2$O$_3$ (0<x≤1, 0≤y≤1, 0<x+y≤1) single crystal which is a β-Ga$_2$O$_3$ single crystal doped with Al and In. The band gap is widened by adding Al and is narrowed by adding In.

A Sn raw material is added to a β-Ga$_2$O$_3$-based raw material so that a desired Sn concentration is obtained. When growing the β-Ga$_2$O$_3$-based single crystal 25 to be cut into, e.g., an LED substrate, SnO$_2$ is added to the β-Ga$_2$O$_3$-based raw material so that the Sn concentration is not less than 0.005 mol % and not more than 1.0 mol %. Satisfactory properties as a conductive substrate are not obtained at the concentration of less than 0.005 mol %. On the other hand, problems such as a decrease in the doping efficiency, an increase in absorption coefficient or a decrease in yield are likely to occur at the concentration of more than 1.0 mol %.

The following is an example of conditions of growing the β-Ga$_2$O$_3$-based single crystal 25 in the present embodiment.

The β-Ga$_2$O$_3$-based single crystal 25 is grown in, e.g., a nitrogen atmosphere.

In the example shown in FIGS. 1 and 2, the seed crystal 20 having substantially the same horizontal cross-sectional size as the Ga$_2$O$_3$-based single crystal 25 is used. In this case, a shoulder broadening process for increasing a width of the Ga$_2$O$_3$-based single crystal 25 is not performed. Therefore, twinning which is likely to occur in the shoulder broadening process can be suppressed.

In this case, the seed crystal 20 is larger than a seed crystal used for typical crystal growth and is susceptible to thermal shock. Therefore, a height of the seed crystal 20 from the die 14 before the contact with the Ga$_2$O$_3$-based melt 12 is preferably low to some extent and is, e.g., 10 mm. In addition, a descending speed of the seed crystal 20 until the contact with the Ga$_2$O$_3$-based melt 12 is preferably low to some extent and is, e.g., 1 min/min.

Standby time until pulling up the seed crystal 20 after the contact with the Ga$_2$O$_3$-based melt 12 is preferably long to some extent in order to further stabilize the temperature to prevent thermal shock, and is, e.g., 10 min.

A temperature rise rate at the time of melting the raw material in the crucible 13 is preferably low to some extent in order to prevent a rapid increase in temperature around the crucible 13 and resulting thermal shock on the seed crystal 20, and the raw material is melted over, e.g., 11 hours.

(Quality Evaluation Method for β-Ga$_2$O$_3$-Based Single Crystal)

A substrate cut out from a seed crystal of the β-Ga$_2$O$_3$-based single crystal grown by the above-mentioned method is mirror-polished and is then subjected to X-ray diffraction measurement to evaluate crystal quality. The crystal quality is evaluated by evaluating variation in crystal structure of the substrate along the direction perpendicular to the b-axis.

Figure 3A:
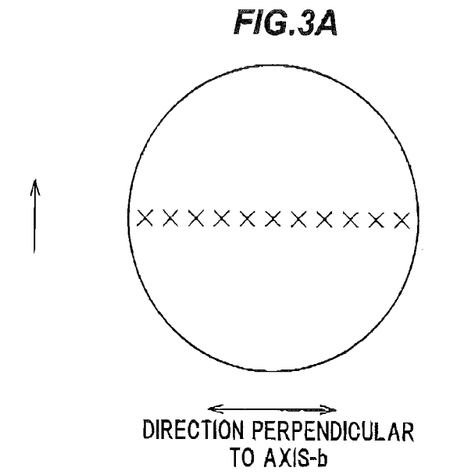
FIG. 3A is a plan view showing a substrate cut out from the β-Ga$_2$O$_3$-based single crystal and X-ray diffraction measurement points thereon.

FIG. 3A is a plan view showing a substrate cut out from the β-Ga$_2$O$_3$-based single crystal and X-ray diffraction measurement points thereon. X-ray diffraction intensity is measured at measurement points shown as "x" in FIG. 3A and aligned along the direction perpendicular to the b-axis while rotating the substrate about the b-axis of the β-Ga$_2$O$_3$-based single crystal, thereby obtaining X-ray diffraction profiles. Here, the rotation angle of the substrate about the b-axis direction is defined as ω [deg].

Figure 3B:
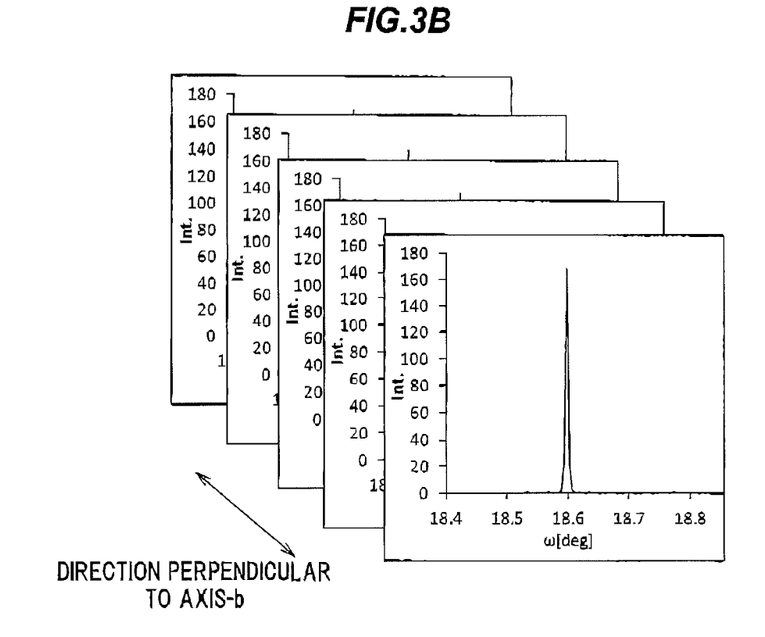
FIG. 3B is an image showing X-ray diffraction profiles which are respectively obtained from the measurement points and are aligned along a direction perpendicular to the b-axis.

FIG. 3B is an image showing X-ray diffraction profiles which are respectively obtained from the measurement points and are aligned along the direction perpendicular to the b-axis.

Figure 4:
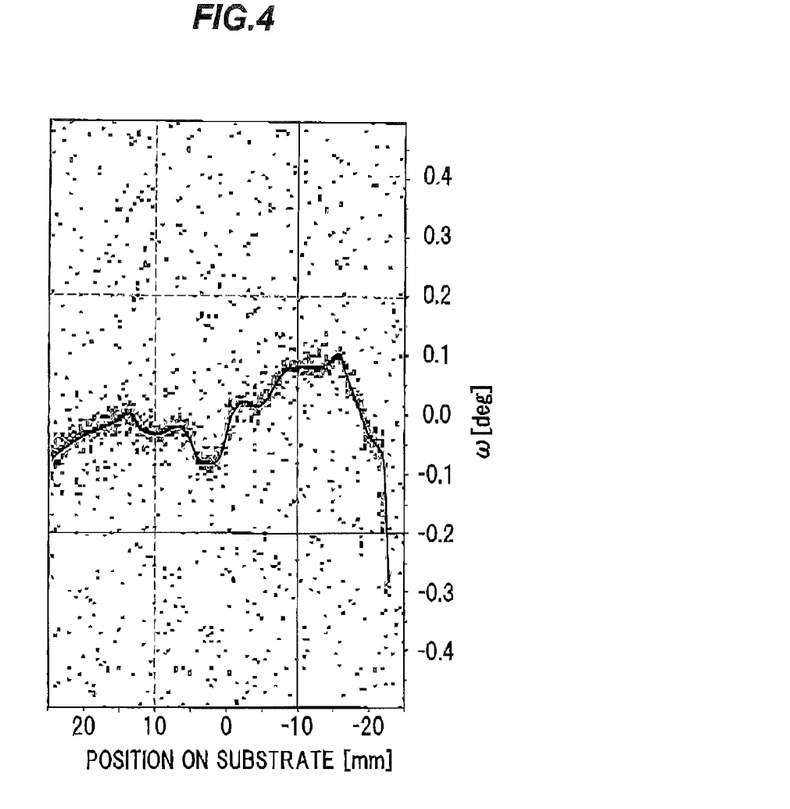
FIG. 4 is a diagram showing X-ray diffraction intensity distribution obtained from the measurement points.

FIG. 4 is a diagram when viewing the FIG. 3B from above and shows X-ray diffraction intensity distribution obtained from the measurement points. In FIG. 4, the horizontal axis indicates a position [mm] on the substrate in the direction perpendicular to the b-axis, and the vertical axis indicates the rotation angle ω [deg] of the substrate. A region with high dot density represents a high X-ray diffraction intensity region and a curved line is formed by connecting the respective peak positions of the X-ray diffraction profiles obtained from the measurement points. On the horizontal axis, positions on the substrate are located with reference to the center of the substrate as the origin.

Figure 5:
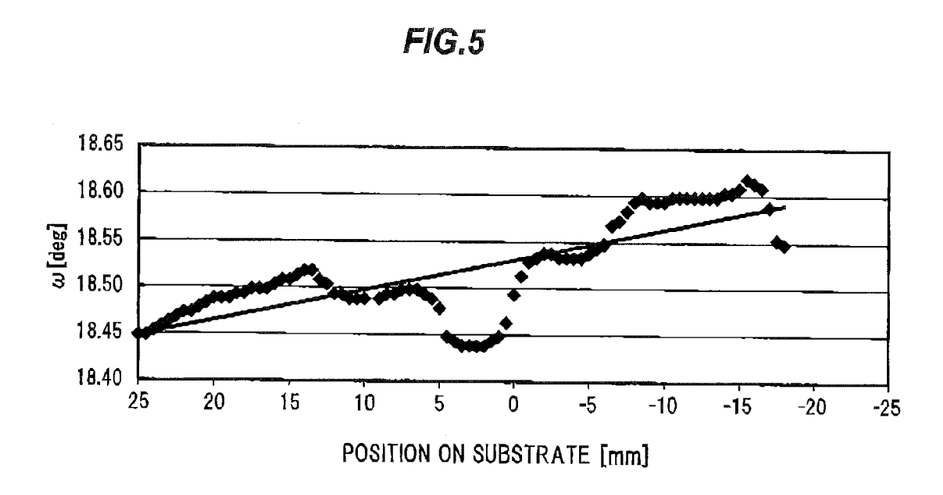
FIG. 5 is a graph showing a curved line representing a relation between a position on the substrate and a peak position of the X-ray diffraction profile, and an approximate line thereof.

FIG. 5 is a graph showing a curved line representing a relation between a position on the substrate and a peak position of the X-ray diffraction profile, and an approximate line thereof obtained by linear approximation using the least squares method. In FIG. 5, the horizontal axis indicates a position [mm] on the substrate in the direction perpendicular to the b-axis, and the vertical axis indicates the rotation angle ω [deg] of the substrate.

From FIG. 5, a difference in the rotation angle ω between the peak position of the X-ray diffraction profile and the approximate line is derived for each position on the substrate, and the average value a is calculated therefrom. The smaller the variation in peak positions of the X-ray diffraction profiles in the direction perpendicular to the b-axis, the smaller the value α, and thus the smaller the variation in crystal structure of the substrate along the direction perpendicular to the b-axis.

(Quality Evaluation Result of β-Ga$_2$O$_3$-Based Single Crystal)

As Examples of the present embodiment, two plate-shaped β-Ga$_2$O$_3$-based single crystals having a (−201) plane as a main surface (crystals A and B) were grown at a Sn doping concentration of 0.05 mol %. Then, a substrate including a point 40 mm from a seed crystal as the center and a substrate including a point 90 mm from a seed crystal as the center were cut out from each of the crystals A and B. The diameter of each substrate was 50 mm.

Likewise, as Comparative Examples, two plate-shaped β-Ga$_2$O$_3$-based single crystals having a (−201) plane as a main surface (crystals C and D) were grown at a Si doping concentration of 0.05 mol %. Then, a substrate including a point 40 mm from a seed crystal as the center was cut out from each of the crystals C and D. The diameter of each substrate was 50 mm.

In addition, as other Comparative Examples, two plate-shaped β-Ga$_2$O$_3$-based single crystals having a (−201) plane as a main surface (crystals E and F) were grown without dopant. Then, a substrate including a point 40 mm from a seed crystal as the center and a substrate including a point 90 mm from a seed crystal as the center were cut out from each of the crystals E and F. The diameter of each substrate was 50 mm.

The width (perpendicular to the crystal growth direction) of the plate-shaped crystals A to F was 52 mm to allow a 50 mm-diameter substrate to be cut out.

Using the above-mentioned evaluation method, variation in crystal structure of substrate along the direction perpendicular to the b-axis was evaluated for the four Sn-doped β-Ga$_2$O$_3$-based single crystal substrates, the two Si-doped β-Ga$_2$O$_3$-based single crystal substrates and the four non-doped β-Ga$_2$O$_3$-based single crystal substrates.

Figure 6A:
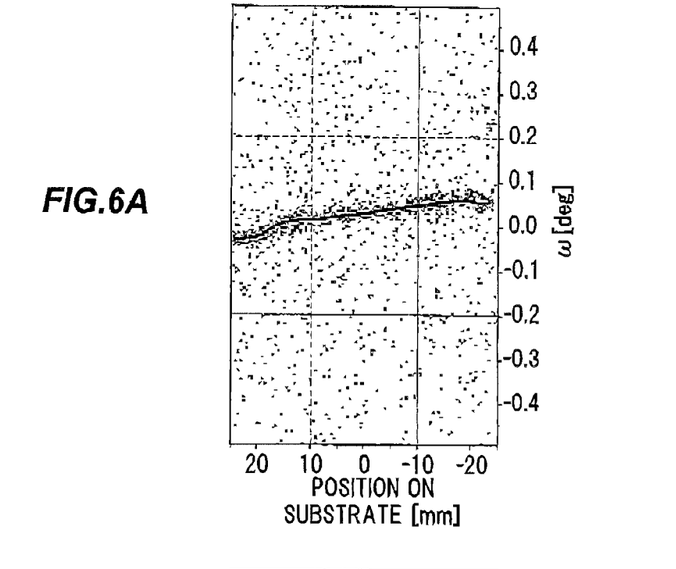
FIG. 6A shows X-ray diffraction intensity distribution obtained from the measurement points on a substrate which is cut out from a crystal A so as to include a point 40 mm from a seed crystal as the center.
Figure 6B:
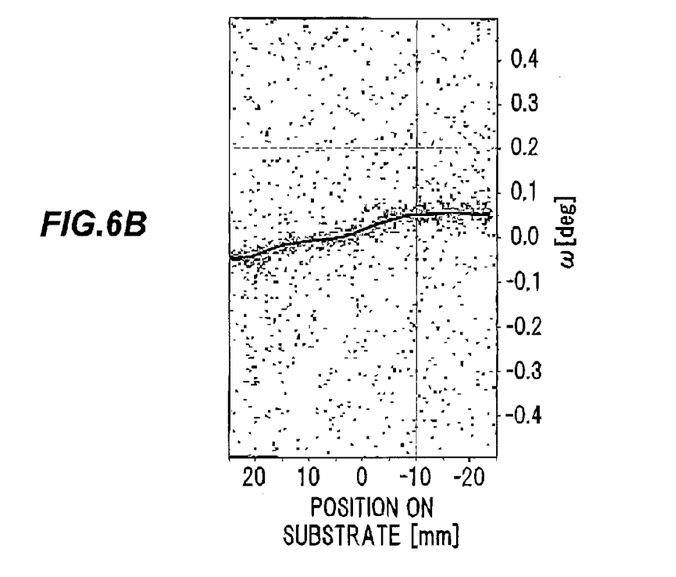
FIG. 6B shows X-ray diffraction intensity distribution obtained from the measurement points on a substrate which is cut out from a crystal B so as to include a point 40 mm from a seed crystal as the center.
Figure 7A:
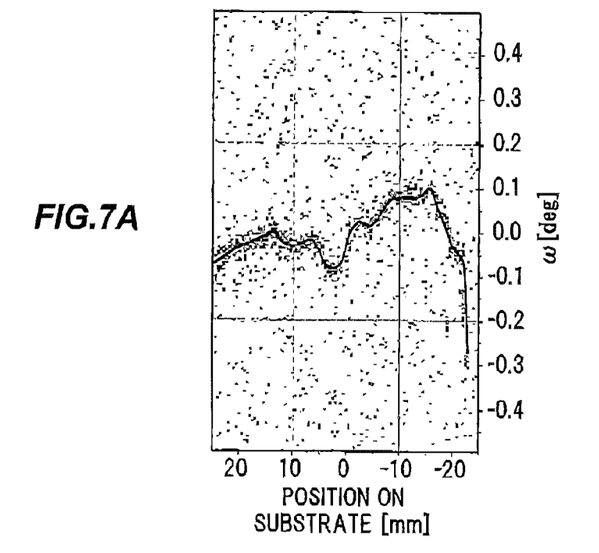
FIG. 7A shows X-ray diffraction intensity distribution obtained from the measurement points on a substrate which is cut out from a crystal C so as to include a point 40 mm from a seed crystal as the center.
Figure 7B:
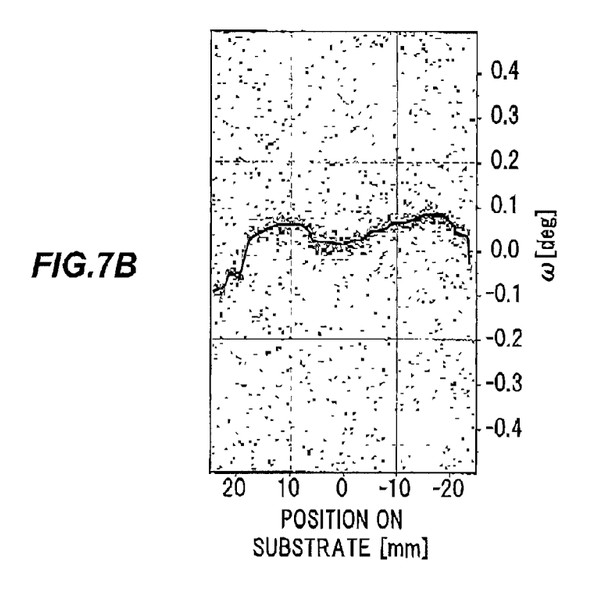
FIG. 7B shows X-ray diffraction intensity distribution obtained from the measurement points on a substrate which is cut out from a crystal D so as to include a point 40 mm from a seed crystal as the center.

FIGS. 6A and 6B are diagrams illustrating X-ray diffraction intensity distribution obtained from the measurement points on the substrates which are respectively cut out from the crystals A and B so as to include a point 40 mm from a seed crystal as the center. FIGS. 7A and 7B are diagrams illustrating X-ray diffraction intensity distribution obtained from the measurement points on the substrates which are respectively cut out from the crystals C and D so as to include a point 40 mm from a seed crystal as the center. FIGS. 6A, 6B, 7A and 7B correspond to FIG. 4.

FIGS. 6A, 6B, 7A and 7B show that the substrates cut out from the Sn-doped crystals A and B have smaller variation in the peak position of X-ray diffraction intensity profile in the direction perpendicular to the b-axis and thus have smaller variation in crystal structure along the direction perpendicular to the b-axis than the substrates cut out from the Si-doped crystals C and D.

Figure 8:
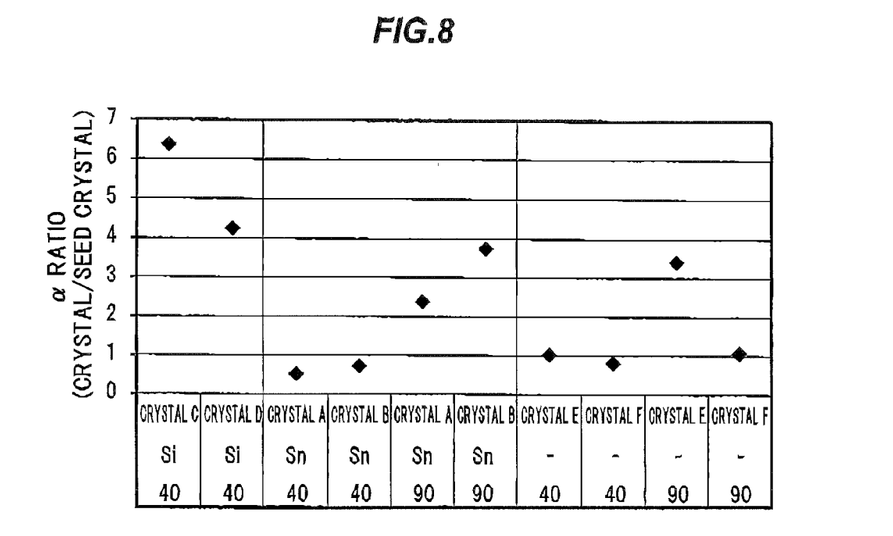
FIG. 8 is a diagram showing a variation in crystal structures of Sn-doped crystal A and B, Si-doped crystals C and D and non-doped crystals E and F along the direction perpendicular to the b-axis.

FIG. 8 is a diagram showing a variation in crystal structures of the Sn-doped crystal A and B, the Si-doped crystals C and D and the non-doped crystals E and F along the direction perpendicular to the b-axis. In FIG. 8, the vertical axis indicates a ratio of α of each crystal to α of a seed crystal. The smaller α ratio means that variation in crystal structure along the direction perpendicular to the b-axis is closer to that of the seed crystal and quality of crystal is higher.

In the sections with letters along the horizontal axis on the bottom of FIG. 8, the upper line is the type of crystal (the crystals A to F) from which the substrates are cut out, the middle line is the type of the added dopant (Si, Sn or no addition), and the lower line is a distance from the seed crystal to the center of the substrate before being cut out from the crystal.

FIG. 8 shows that the a ratio of the Sn-doped crystals A and B is smaller than the a ratio of the Si-doped crystals C and D and the crystals A and B have small variation in crystal structure along the direction perpendicular to the b-axis. It is also shown that the a ratio of the Sn-doped crystals A and B is close to the a ratio of the non-doped crystals E and F, and variation in crystal structure of the Sn-doped β-Ga$_2$O$_3$-based single crystal along the direction perpendicular to the b-axis is close to that of the non-doped β-Ga$_2$O$_3$-based single crystal.

Generally, crystal quality of grown crystal decreases with an increase in distance from the seed crystal. However, variation in crystal structure along the direction perpendicular to the b-axis is smaller in a region of the Sn-doped crystals A and B at a distance of 90 mm from the seed crystal than in a region of the Si-doped crystals C and D at a distance of 40 mm from the seed crystal. This shows that it is possible to significantly reduce variation in crystal structure of the β-Ga$_2$O$_3$-based single crystal along the direction perpendicular to the b-axis by adding Sn instead of Si.

Variation in crystal structure along the b-axis direction was also evaluated using the same evaluation method. As a result, variation in crystal structure along the b-axis direction was hardly observed both in the Sn-doped β-Ga$_2$O$_3$-based single crystals and the Si-doped β-Ga$_2$O$_3$-based single crystals.

Effects of the Embodiment

According to the present embodiment, by using Sn as a dopant to impart electrical conductivity to a β-Ga$_2$O$_3$-based single crystal, a high-quality β-Ga$_2$O$_3$-based single crystal having small variation in crystal structure can be grown in the b-axis direction.

As an example, when growing a plate-shaped β-Ga$_3$O$_3$-based single crystal which is doped with Sn and is not less than 65 mm in length and 52 min in width, a 50 mm-diameter conductive substrate with excellent crystal quality can be obtained from a region centered at a point 40 mm from a seed crystal.

The effects of the present embodiment do not depend on the Sn doping concentration and it has been confirmed that variation in crystal structure of the β-Ga$_2$O$_3$-based single crystal along the direction perpendicular to the b-axis is substantially the same at least up to 1.0 mol %.

Although the embodiment of the invention has been described, the invention is not intended to be limited to the embodiment, and the various kinds of modifications can be implemented without departing from the gist of the invention.

In addition, the invention according to claims is not to be limited to the embodiment described above. Further, it should be noted that all combinations of the features described in the embodiment are not necessary to solve the problem of the invention.

INDUSTRIAL APPLICABILITY

A method for growing a $\beta$-$Ga_2O_3$-based single crystal, which allows a high-quality $\beta$-$Ga_2O_3$-based single crystal having small variation in crystal structure to grow in the b-axis direction, is provided.

REFERENCE SIGNS LIST

10: EFG CRYSTAL MANUFACTURING APPARATUS
20: SEED CRYSTAL
25: $\beta$-$Ga_2O_3$-BASED SINGLE CRYSTAL

The invention claimed is:

1. A method for growing a plate-shaped Sn-doped $\beta$-$Ga_2O_3$-based single crystal, comprising growing the plate-shaped Sn-doped $\beta$-$Ga_2O_3$-based single crystal in a direction of a b-axis using a seed crystal, wherein the growing is carried out by an edge-defined film-fed growth method without shoulder broadening of the single crystal with respect to the seed crystal, and wherein a concentration of Sn doped into the $\beta$-$Ga_2O_3$-based single crystal is not less than 0.005 mol % and not more than 1.0 mol % thereby suppressing crystal quality variation in a direction perpendicular to the b-axis direction.

* * * * *